United States Patent
Berrou et al.

(10) Patent No.: US 6,782,504 B1
(45) Date of Patent: Aug. 24, 2004

(54) CODING SCHEME AND DEVICE WITH AT LEAST TWO PARALLEL CODIFICATIONS AND IMPROVED PERMUTATION, AND CORRESPONDING DECODING SCHEME AND DEVICE

(75) Inventors: Claude Berrou, Locmaria Plouzane (FR); Alain Glavieux, Plouzane (FR)

(73) Assignees: Groupe des Ecoles de Telecommunications, Paris Cedex (FR); France Telecom, Paris (FR)

( * ) Notice: Subject to any disclaimer, the term of this patent is extended or adjusted under 35 U.S.C. 154(b) by 143 days.

(21) Appl. No.: 09/616,782

(22) Filed: Jul. 14, 2000

(30) Foreign Application Priority Data

Jul. 21, 1999 (FR) .............................. 99 09631

(51) Int. Cl.[7] ........................ H03M 13/03; H03M 13/00
(52) U.S. Cl. ...................................... 714/786; 714/755
(58) Field of Search ................................ 714/786, 755

(56) References Cited

U.S. PATENT DOCUMENTS

| | | | |
|---|---|---|---|
| 4,394,642 A | | 7/1983 | Currie et al. ............... 340/347 |
| 5,446,747 A | * | 8/1995 | Berrou ....................... 375/340 |
| 5,898,698 A | * | 4/1999 | Bross ........................ 714/701 |
| 5,996,104 A | * | 11/1999 | Herzberg .................... 714/701 |
| 6,023,783 A | * | 2/2000 | Divsalar et al. ............ 375/262 |
| 6,029,264 A | * | 2/2000 | Kobayashi et al. .......... 714/755 |

FOREIGN PATENT DOCUMENTS

| | | | |
|---|---|---|---|
| FR | 2 675 971 | 10/1992 | .......... H03M/13/22 |
| FR | 2 712 760 | 5/1995 | ........... H04L/25/02 |
| WO | 99 07076 | 11/1999 | |

OTHER PUBLICATIONS

Aitsab, Omar; Pyndiah, Ramesh; "Performance of Reed–Solomon Block Turbo Code"; p. 121–125; IEEE 1996.
Berrou, C; Jezequel, M.; "Non–binary convolutional codes for turbo coding", Jan. 7, 1999, vol. 35, No. 1; p. 39.
Berrou, C.; Glavieux, A.; "Near Optimum Error Correcting Coding and Decoding: Turbo–Codes"; p. 1261–1271; IEEE 1996.
French Search Report.

* cited by examiner

*Primary Examiner*—Guy J. Lamarre
*Assistant Examiner*—Esaw Abraham
(74) *Attorney, Agent, or Firm*—Merchant & Gould, P.C.

(57) ABSTRACT

A scheme for coding digital source data, implementing, in parallel, at least two elementary coding steps each taking into account all of the source data, and including a permutation step modifying a sequence of consideration of the source data between the elementary coding steps. In one example, the source data is organized in sequences of non-binary symbols, each non-binary symbol including n binary source elements, n being greater than or equal to 2. The example permutation step includes reversibly modifying contents of at least some of the non-binary symbols, delivering modified non-binary symbols, and permutating the sequence of the source or modified non-binary symbols.

18 Claims, 1 Drawing Sheet

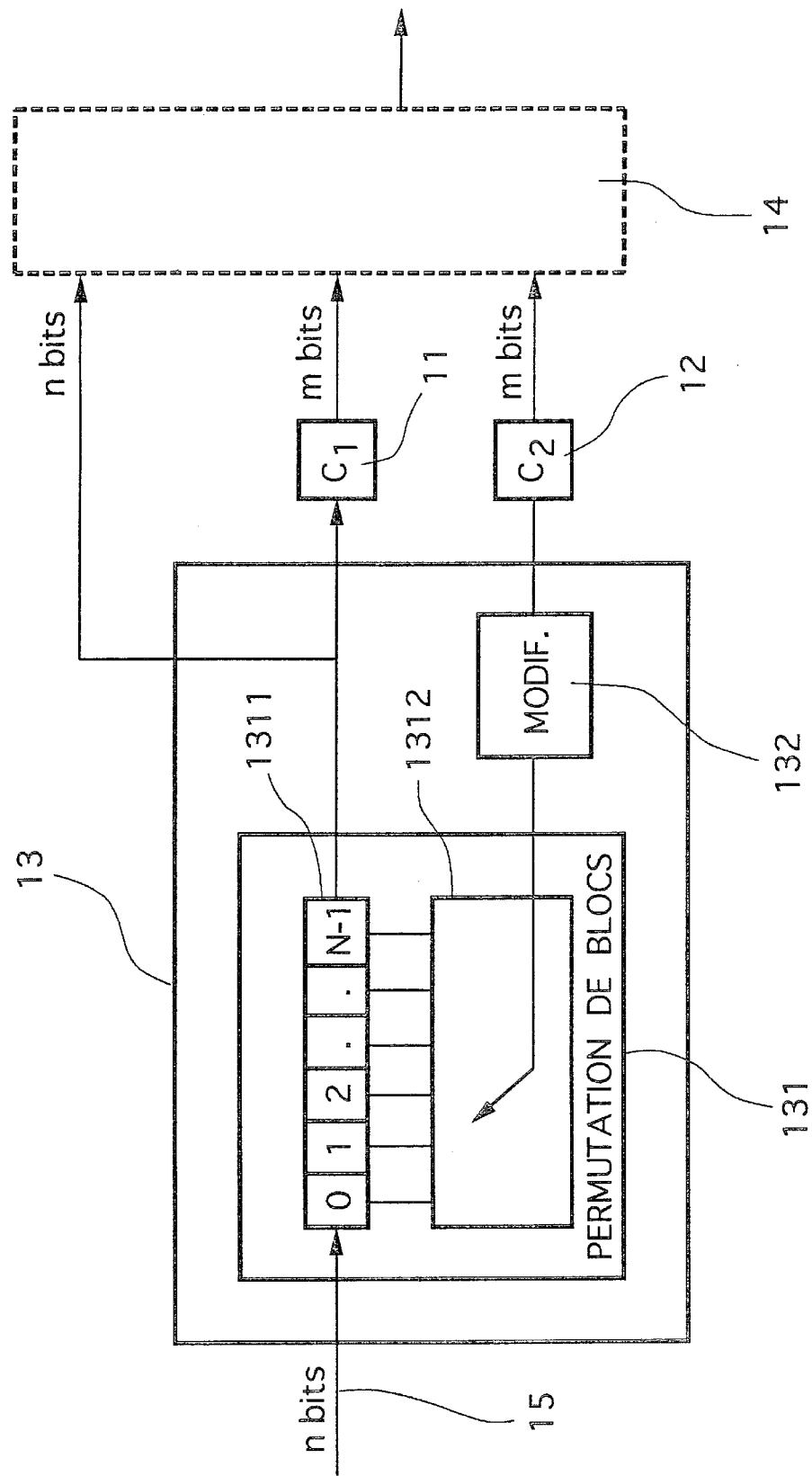

CODING SCHEME AND DEVICE WITH AT LEAST TWO PARALLEL CODIFICATIONS AND IMPROVED PERMUTATION, AND CORRESPONDING DECODING SCHEME AND DEVICE

The field of the invention is that of coding digital data belonging to one or more source data sequences to be transmitted, or broadcasted, in particular in the presence of circuit transients, and decoding coded data thus transmitted.

More precisely, this invention relates to an improvement of the coding scheme known in particular as "turbo codes" (registered trademark), and more particularly of the permutation implemented thereby.

The general principle of this kind of coding is introduced in particular in French patent no. FR-9 105 280, entitled "Procédé de codage correcteur d'erreurs à au moins deux codages convolutifs systématiques paralléles, procédé de décodage itératif, module de décodage et décodeur correspondants", and in the article by C. Berrou and A. Glavieux "Near Optimum Error Correcting Coding and Decoding: Turbo Codes" (IEEE Transactions on Communications, Volume 44, no. 10, pages 1261–1271, October 1996).

According to this technique, the implementation of "parallel concatenation" coding is suggested, based on using at least two elementary encoders. When decoding, this makes it possible to have two redundancy symbols from two distinct encoders. Between the two elementary encoders, a permutation means is implemented, so that each of these elementary encoders is supplied with the same digital source data, but taken in varying sequences.

An improvement of this kind of technique, for block coding (product codes), is described in the patent FR-9 313 858, and entitled "Turbo décodage des codes produits", as well as in the article by O. Aitsab and R. Pyndiah "Performance of Reed Solomon block turbo code" (IEEE Globecom '96 Conference, Vol. 1/3, pages 121–125, London, November 1996).

To a relatively large extent, the performance of parallel concatenation convolutional "turbo codes" depends on the implemented permutation function. Indeed, it appears that a non-optimized choice of this function can lead to "turbo code" degradation, including in particular the occurrence of a gradient change in the error rate curve below $10^{-5}$ and $10^{-6}$.

This phenomenon is all the more emphasized the higher the efficiency of the "turbo codes" under consideration, and the shorter the information blocks to be coded.

In the various documents quoted, permutation functions allowing to build "turbo codes" with good performance have been suggested.

In the patent FR-9 105 280, the elementary convolutional codes are binary, and permutations therefore take place directly on binary elements. More in general, many solutions for carrying out the permutation function in a parallel concatenation "turbo code" implementing binary convolutional codes have been suggested as part of third generation mobile phones (UMTS).

The patent FR-9 313 858, as well as the article by C. Berrou and M. Jezequel "Non-binary convolutional codes for turbo coding", (Electronics Letters, Vol. 35, no. 1, pages 39–40, January 1999), also suggest using non-binary convolutional codes for building "turbo codes". In this case, the permutation function therefore applies to the binary words (bit sets, e.g. pairs, or more generally n-pairs).

Generally speaking, the permutation function must of course allow to provide good dispersion of the elements from the information source and feeding the various parallel encoders, in order to create a strong random effect. Therefore, the distance properties of the composite encoder must be optimized, and in particular the minimum distance thereof maximized.

Thus, it is in particular an object of the invention to provide a parallel concatenation coding scheme ("turbo codes") built from non-binary convolutional codes and having better permutation characteristics than those of known "turbo codes".

More precisely, it is an object of the invention is to provide a parallel concatenation coding scheme optimizing the distance properties of the composite encoder (the "turbo code"), i.e. in particular maximizing the minimum distance thereof.

It is another object of the invention to provide such a coding scheme, creating a strong random effect on the data feeding the various elementary encoders, of course without modifying the dispersion effect.

It is also an object of the invention to provide such a coding scheme that is easy to implement in practice, at low cost, e.g. as an integrated circuit.

It is yet another object of the invention to provide such a coding scheme that is easy to implement for a very large number of application types.

These objects, as well as others that will be apparent more clearly hereafter, are achieved according to the invention by means of a digital source data coding scheme, implementing in parallel at least two elementary coding steps each taking into account all of said source data, and comprising a permutation step modifying the sequence of consideration of said source data between said elementary coding steps, wherein said source data is organized in source code words each comprising n binary source elements, n being greater than or equal to 2. According to the invention, said permutation step comprises:

a step of reversibly modifying the contents of at least some of said source code words, delivering modified code words;

a step of permutating the sequence of said source or modified code words.

In other words, the invention proposes to take effect at two levels, during the permutation step (the visual term of "permutation" is maintained here, but the terms of "shuffling", or "processing" could be used advantageously, because, as will be apparent later on, it is possible to modify the value of certain binary elements). Indeed, on the one hand, the sequence of the code words (or multiples of n), and on the other hand, the contents of the latter (intra-word modification) is acted upon.

It will be noted that word permutation can just as well be performed before or after processing the words as such.

According to an advantageous embodiment, said step of permutating the code word sequence implements a uniform permutation applied to a block of N consecutive code words.

This technique is very easy to implement, and allows to achieve almost optimal efficiency.

It can be implemented advantageously using a memory containing N code words entered in the sequence from 0 to N−1 and reread in the sequence from j=P.i, i varying from 0 to N−1, P and N mutually being prime numbers.

Preferably, in this case, P is close to √N.

According to a preferred approach of the invention, said contents modification is applied only to some of said code words. E.g., said contents modification is applied to every other code word.

Advantageously, said contents modification comprises a permutation of the sequence of binary elements within the code word under consideration.

According to another advantageous aspect, said contents modification comprises replacing at least one of the binary source elements of the code word under consideration with a combination of at least two of said binary source elements.

Said code words can in particular be pairs. However, they can of course more generally be multiples of n, whatever the value of n, greater than or equal to 2.

In the case of pairs, the combinations can associate with the source pair {a,b} at least one of the following modified pairs:

(a,b)
(b,a)
(a+b,b)
(b,a+b)
(a,a+b)
(a+b,a)

According to an embodiment of the invention, at least one of said elementary coding steps implements a systematic recursive convolutional code, naturally yielding n/(n+m), associating n+m binary outputs with n binary inputs, with n>2 and m>1.

Advantageously, the scheme associates $n+m_1+m_2$ binary outputs with a code word of n binary inputs comprising:

the n binary inputs;
$m_1$ binary outputs delivered by a first elementary coding step;
$m_2$ binary outputs delivered by a second elementary coding step.

A stamping step can be provided.

Of course, the invention also relates to the corresponding coding devices. Such a device implements a permutation means comprising:

a means for reversibly modifying the contents of at least some of said source code words, delivering modified code words;
a means for permutating the sequence of said source or modified code words.

The invention further relates to devices for emitting or transmitting data coded according to the scheme described above.

According to another aspect, the invention relates to the corresponding decoding schemes and devices. Symmetrically to coding, the decoding scheme comprises the steps of:

modifying the contents of at least some of the received code words, said modification being the opposite of that implemented during coding;
permutating the sequence of the received code words, in order to put them back in the initial sequence.

Other characteristics and advantages of the invention will be more apparent from reading the following description of a preferred embodiment of the invention, merely given by way of an illustrative example and not to be restrictive, and:

the only appended figure, illustrating the general idea of an encoder according to the invention.

The invention therefore offers a new permutation function for an elementary code parallel concatenating encoder, which, in conjunction with non-binary systematic recursive convolutional elementary codes, naturally yielding n/(n+m), with n≧2 and n≧1, results in performance close to the theoretical limit, and whatever the efficiency considered for the "turbo code" and the length of the information blocks to be coded.

It is recalled that, in the scope of the invention, the elementary codes under consideration are necessarily non-binary, i.e. they have n≧2 binary inputs and n+m, with m≧1, binary outputs.

A sample coding device according to the invention is illustrated in FIG. 1. The corresponding coding scheme can directly be derived thereof.

In this example, a code, built from the parallel concatenation of two elementary codes $C_1$ and $C_2$, 11 and 12, which are identical, convolutional, recursive, systematic, non-binary, yielding ⅔(n=2 binary inputs: the code words are pairs) separated by a permutation function 13, is considered.

Moreover, it is presumed that the block of data to be coded is composed of p binary data, with p being even or, in the same way, N=p/2 binary pairs.

If the composite encoder is not stamped, its coding efficiency is then equal to ½. Of course, stamping 14 can be implemented conventionally.

As mentioned before, according to the invention, the permutation function 13 is based on a twofold operation:

permutating 131 the sequence of the code words (pairs in the example, but more generally any multiple of n);
processing 132 at least some of the data blocks.

The N pairs from the information source 15 supply elementary encoder $C_1$ then, after permutation 13, encoder $C_2$.

A permutation function must allow to provide a good dispersion of the pairs (more generally of the multiples of n) from the information source 15, and to create a strong random effect. One of the objects to be achieved is indeed optimizing the distance properties of the composite encoder and in particular maximizing the minimum distance thereof.

Regarding the dispersion criterion, after permutation 13, the adjacent pairs (more generally the multiples of n) at the output of the information source 15, must be separated as much as possible. This objective can be achieved, almost optimally, by using a uniform permutation 131 at pair level (more generally at the level of the multiple of n).

This uniform permutation 131 can be performed by uniformly writing the N binary pairs (more generally the multiples of n) into a memory 1311 at N positions (positions 0 to N−1) and by successively reading (1312) these N pairs at addresses j, with the following rule:

$$J = pi \bmod N \quad i=0, 1 \ldots (N-1) \tag{1}$$

To go through the N positions of memory 1311 once and only once, P and N must mutually be two prime numbers (i.e. they must have no other common divisor than 1).

Moreover, to provide optimal spacing between the adjacent pairs (more generally the multiples of n) at the output of source 15, the parameter P is preferably close to $\sqrt{N}$.

To illustrate this aspect, e.g. a block of N=9 binary pairs to be coded is considered. P is set to 4 (4 is close to $\sqrt{9}=3$). The following is obtained:

| i | 0 | 1 | 2 | 3 | 4 | 5 | 6 | 7 | 8 |
|---|---|---|---|---|---|---|---|---|---|
| j | 0 | 4 | 8 | 3 | 7 | 2 | 6 | 1 | 5 |

Thus, the N pairs to be coded by encoder $C_2$ are respectively read at the addresses 0, 4, 8, 3, 7, 2, 6, 1, 5.

In order to create this random effect, without modifying the dispersion effect, the binary data of (at least) certain pairs (more generally of certain multiples of n) undergo a processing operation 132, or an appropriate modification.

A simple and very efficient processing operation 132 consists in periodically permutating the binary data within a pair, before presenting it to the elementary encoder $C_2$, e.g. according to the following rule:

let $\{a_k, b_k\}$ be the binary pair stored at position k, k=0, 1, ... (N−1) in memory. For the odd values of variable i, the binary data of the pair read at address j according to rule (1) is permutated before being presented to encoder $C_2$.

Referring back to the previous example, the N=9 pairs to be encoded by encoder $C_2$ are then presented in the following sequence:

$\{a_0, b_0\}$, $\{b_4, a_4\}$, $\{a_8, b_8\}$, $\{b_3, a_3\}$, $\{a_7, b_7\}$, $\{b_2, a_2\}$, $\{a_6, b_6\}$, $\{b_1, a_1\}$, $\{a_5, b_5\}$

Pairs having undergone a permutation have been printed in bold.

Of course, operations other than permutating the binary data of the pair are possible, such as for instance:

$\{a_k, b_k\} \rightarrow \{a_k+b_k, b_k\}$ or $\{a_k, b_k\} \rightarrow \{b_k, a_k+b_k\}$ mod 2 or $\{a_k, b_k\} \rightarrow \{a_k, a_k+b_k\}$ or $\{a_k, b_k\} \rightarrow \{a_k+b_k, a_k\}$ mod 2

Of course, the operation performed on the binary data of each pair can be reversed. Indeed, e.g. knowing $\{a_k+b_k, b_k\}$, $a_k$ is obtained by summing up the components $\{a_k+b_k\}$ and $\{b_k\}$.

Possibly, several operations can be cumulated and/or used alternatively.

In the example illustrated in FIG. 1, data block processing 132 is performed after the permutation 131 of these same blocks. It is clear, however, that the sequence of these operations can be inverted. It is possible to perform first of all the processing operation on code words (multiples of n) then the permutation thereof.

This permutation method therefore allows "turbo codes" to be built from a parallel concatenation of systematic recursive convolutional codes, naturally yielding n/(n+m); $n \geq 2$; $m \geq 1$.

The distance, and in particular the minimum distance properties, of these "turbo codes" are superior to those of known convolutional "turbo codes". This result is all the more pronounced the greater the "turbo code" coding efficiency and the shorter the blocks of binary data to be encoded.

This permutation function is therefore particularly designed for building convolutional block "turbo codes", for transmission coding where data is structured in short frames (e.g., ATM).

Decoding implements the reverse operations of those implemented during coding, namely:

modifying the contents of the received code words (reverse modification), in order to restore the original code words (except for interference due to the transmission channel);

permutating the sequence of the received code words, in order to put them back in the initial sequence.

The general idea of complete decoding is advantageously similar to that described in the patent FR-9 105 280 already mentioned. However, the elementary information exchanged by the elementary decoders (called extrinsic information) is of course no longer binary values but code words or multiples of n.

The extrinsic information is therefore carried by $2^n$ values, corresponding to the $2^n$ cases possible for the multiples of n. For pairs, as described before, the elementary decoders therefore exchange data four at a time.

What is claimed is:

1. A scheme for coding digital source data, implementing in parallel at least two elementary coding steps each taking into account all of said source data, and comprising a permutation step modifying a sequence of consideration of said source data between said elementary coding steps, wherein said source data is organized in sequences of non-binary symbols each said non-binary symbol comprising n binary source elements, n being greater than or equal to 2, and in that said permutation step comprises:

reversibly modifying contents of at least some of said non-binary symbols, delivering modified non-binary symbols; and permutating the sequence of said source or modified non-binary symbols.

2. The coding scheme according to claim 1, wherein said step of permutating the non-binary symbol sequence implements a uniform permutation applied to a block of N consecutive non-binary symbols.

3. The coding scheme according to claim 2, wherein said uniform permutation uses a memory containing N non-binary symbols entered in sequence from 0 to N−1 and reread in sequence from j=P.i, i varying from 0 to N−1, and P and N mutually being prime numbers.

4. The coding scheme according to claim 3, wherein said P is close to $\sqrt{N}$.

5. The coding scheme according to claim 1, wherein said contents modification is applied only to some of said non-binary symbols.

6. The coding scheme according to claim 5, wherein said contents modification is applied to every other non-binary symbol.

7. The coding scheme according to claim 1, wherein said contents modification comprises a permutation of the sequence of the binary elements within the considered non-binary symbol.

8. The coding scheme according to claim 1, wherein said contents modification comprises replacing at least one of the binary source elements of the considered non-binary symbol with a combination of at least two of said binary source elements.

9. The coding scheme according to claim 1, wherein said non-binary symbols are pairs of binary elements.

10. The coding scheme according to claim 9, wherein said contents modifying step associates with the source pair {a, b} at least one of the following modified pairs:

(a, b);

(b, a);

(a+b, b);

(b, a+b);

(a, a+b); and (a+b, a).

11. The coding scheme according to claim 1, wherein at least one of said elementary coding steps implements a systematic recursive convolutional code, naturally yielding n/(n+m), associating n+m binary outputs with n binary inputs, with n>2 and m>1.

12. The coding scheme according to claim 1, wherein the scheme associates $n+m_1+m_2$ binary outputs with a non-binary symbol of n binary inputs comprising:

the binary inputs $m_1$ binary outputs delivered by a first elementary coding step; and $m_2$ binary outputs delivered by a second elementary coding step.

13. The coding scheme according to claim 1, wherein the scheme implements a stamping step.

14. A scheme for decoding digital data coded according to the coding scheme of claim 1, including a permutation step comprising:

a step of modifying contents of at least some received non-binary symbols, said modification being opposite of that implemented during coding; and a step of permutating a sequence of the received non-binary symbols, in order to put them back in initial sequence.

15. A device for transmitting and/or receiving digital data according to the decoding scheme of claim 14.

16. A device for decoding digital data coded according to the coding scheme of claim 1, including a permutation means comprising:

a means for modifying contents of at least some received non-binary symbols, said modification being opposite of that implemented during coding; and a means for permutating a sequence of the received non-binary symbols, in order to put them back in initial sequence.

17. A device for transmitting and/or receiving digital data coded according to the coding scheme of claim 1.

18. A device for coding digital source data comprising at least two elementary encoders each taking into account all of said source data, and a permutation means modifying a sequence of consideration of said source data by each of said elementary encoders, wherein said source data is organized in non-binary symbol each comprising n binary source elements, n being greater than or equal to 2, and wherein said permutation means comprises:

a means for reversibly modifying contents of at least some of said non-binary symbols, delivering modified non-binary symbols; and a means for permutating the sequence of said source or modified non-binary symbols.

* * * * *